(12) United States Patent
Yagi et al.

(10) Patent No.: US 8,789,265 B2
(45) Date of Patent: Jul. 29, 2014

(54) ELECTRONIC COMPONENT MOUNTING METHOD PROVIDING A SUBSTRATE STANDBY AREA

(75) Inventors: Shuzo Yagi, Saga (JP); Masao Nakane, Fukuoka (JP); Noboru Furuta, Fukuoka (JP)

(73) Assignee: Panasonic Corporation, Osaka (JP)

( * ) Notice: Subject to any disclaimer, the term of this patent is extended or adjusted under 35 U.S.C. 154(b) by 909 days.

(21) Appl. No.: 12/194,310

(22) Filed: Aug. 19, 2008

(65) Prior Publication Data

US 2009/0049682 A1    Feb. 26, 2009

(30) Foreign Application Priority Data

Aug. 23, 2007   (JP) .................................. 2007-217039

(51) Int. Cl.
   *B23P 19/00* (2006.01)
(52) U.S. Cl.
   USPC ................................ 29/740; 29/832; 198/817
(58) Field of Classification Search
   USPC .................. 29/740–743, 710–712, 833–834; 198/341, 817, 369.1; 414/752, 737
   See application file for complete search history.

(56) References Cited

U.S. PATENT DOCUMENTS

| | | | |
|---|---|---|---|
| 5,517,748 A * | 5/1996 | Park | 29/741 |
| 5,778,524 A * | 7/1998 | Stridsberg | 29/836 |
| 6,643,917 B1 * | 11/2003 | Gieskes | 29/740 |
| 6,944,943 B2 * | 9/2005 | Cho et al. | 29/740 |
| 7,010,853 B2 * | 3/2006 | Oe | 29/740 |
| 7,032,304 B2 * | 4/2006 | Gieskes | 29/832 |
| 7,036,213 B2 * | 5/2006 | Kabeshita et al. | 29/740 |
| 7,549,221 B2 * | 6/2009 | Kim et al. | 29/832 |
| 8,125,651 B2 * | 2/2012 | Yagi et al. | 356/614 |

FOREIGN PATENT DOCUMENTS

| | | |
|---|---|---|
| JP | 04-035100 A | 2/1992 |
| JP | 05-102699 A | 4/1993 |
| JP | 2000-031698 | 1/2000 |
| JP | 2002-050894 A | 2/2002 |
| JP | 2002-271091 A | 9/2002 |
| JP | 2005-093589 A | 4/2005 |

* cited by examiner

*Primary Examiner* — Minh Trinh
(74) *Attorney, Agent, or Firm* — Pearne & Gordon LLP (57) ABSTRACT

In an electronic component mounting system including a plurality of electronic component mounting apparatuses coupled in series, the system mounting an electronic component on a substrate to manufacture a mounted substrate, a substrate carried into a mounting conveyor is temporarily placed in a standby state in a substrate standby area formed by a first transfer conveyor (carry-in conveyor) of one electronic component mounting apparatus and a second transfer conveyor (carry-out conveyor) of another electronic component mounting apparatus positioned upstream of the one electronic component mounting apparatus.

2 Claims, 9 Drawing Sheets

ELECTRONIC COMPONENT MOUNTING METHOD PROVIDING A SUBSTRATE STANDBY AREA

BACKGROUND OF THE INVENTION

The present invention relates to an electronic component mounting system and an electronic component mounting method for mounting an electronic component on a substrate.

RELATED ART

An electronic component mounting system for mounting an electronic component on a substrate is composed of a plurality of electronic component mounting apparatuses coupled to each other. An electronic component mounting apparatus includes a substrate transfer mechanism for horizontally transferring a substrate. Electronic components are sequentially mounted on a target substrate as each electronic component mounting apparatus is being moved from upstream to downstream by the substrate transfer mechanism. As a substrate transfer mechanism, a belt-conveyor type substrate transfer mechanism is often used (for example, refer to Japanese Patent JP-3671681).

In order to enhance the efficiency of work by an electronic component mounting system, it is necessary to minimize the substrate transfer time necessary for carrying a target substrate into/out of the mounting work position by a component mounting mechanism thus eliminating waste of time. To this end, an electronic component mounting apparatus of the electronic component mounting system includes a carry-in conveyor functioning as a standby area for placing a substrate carried from upstream into a standby state just before the mounting work position and a carry-out conveyor for carrying out a substrate that has undergone the component mounting work without delay once the work is complete.

In case such a carry-in conveyor and a carry-out conveyor are provided, the size of each of these conveyors in the transfer direction must be set to correspond to the maximum size of a target substrate. This necessarily increases the dimension of an electronic component mounting apparatus in the length direction. Thus, in the related art, it has been difficult to provide an electronic component mounting system having a compact facility that eliminates the waste of time attributable to transfer of substrates.

SUMMARY OF THE INVENTION

An object of the invention is to provide an electronic component mounting system and an electronic component mounting method for eliminating the waste of time attributable to transfer of substrates and enhancing the production efficiency by a compact facility.

The invention provides an electronic component mounting system including a plurality of electronic component mounting apparatuses coupled in series, the system mounting an electronic component on a substrate to manufacture a mounted substrate, characterized in that the electronic component mounting apparatus includes: a work operation mechanism for performing predetermined work operation for manufacturing a mounted substrate from the substrate; a work conveyor for transferring the substrate to a work position by the work operation mechanism by a belt-conveyor; a carry-in conveyor arranged adjacent to the work conveyor upstream thereof for carrying into the work conveyor the substrate carried in from upstream; and a carry-out conveyor arranged adjacent to the work conveyor downstream thereof for carrying the substrate out of the work conveyor; and that, while the plurality of electronic component mounting apparatuses are coupled in series, the carry-in conveyor of one electronic component mounting apparatus and the carry-out conveyor of another electronic component mounting apparatus positioned upstream of the one electronic component mounting apparatus form a substrate standby area for temporarily placing in a standby state a substrate carried into the work conveyor of the one electronic component mounting apparatus.

The invention provides an electronic component mounting method for mounting an electronic component on a substrate and manufacturing a mounted substrate by an electronic component mounting system including a plurality of electronic component mounting apparatuses coupled in series, characterized in that the electronic component mounting apparatus includes: a work operation mechanism for performing predetermined work operation for manufacturing a mounted substrate from the substrate; a work conveyor for transferring the substrate to a work position by the work operation mechanism by a belt-conveyor; a carry-in conveyor arranged adjacent to the work conveyor upstream thereof for carrying into the work conveyor the substrate carried in from upstream; and a carry-out conveyor arranged adjacent to the work conveyor downstream thereof for carrying the substrate out of the work conveyor; and that, while the plurality of electronic component mounting apparatuses are coupled in series, wherein a substrate carried into the work conveyor of one electronic component mounting apparatus is temporarily placed in a standby state in a substrate standby area formed by the carry-in conveyor of the one electronic component mounting apparatus and the carry-out conveyor of another electronic component mounting apparatus positioned upstream of the one electronic component mounting apparatus.

According to the invention, while a plurality of electronic component mounting apparatuses are coupled in series, a substrate carried into a work conveyor is temporarily placed in a standby state in a substrate standby area formed by the carry-in conveyor of one electronic component mounting apparatus and the carry-out conveyor of another electronic component mounting apparatus positioned upstream of the one electronic component mounting apparatus. This eliminates the waste of time attributable to transfer of substrates and enhances the production efficiency by a compact facility.

DETAILED DESCRIPTION OF THE PREFERRED EMBODIMENTS

Figure 1:
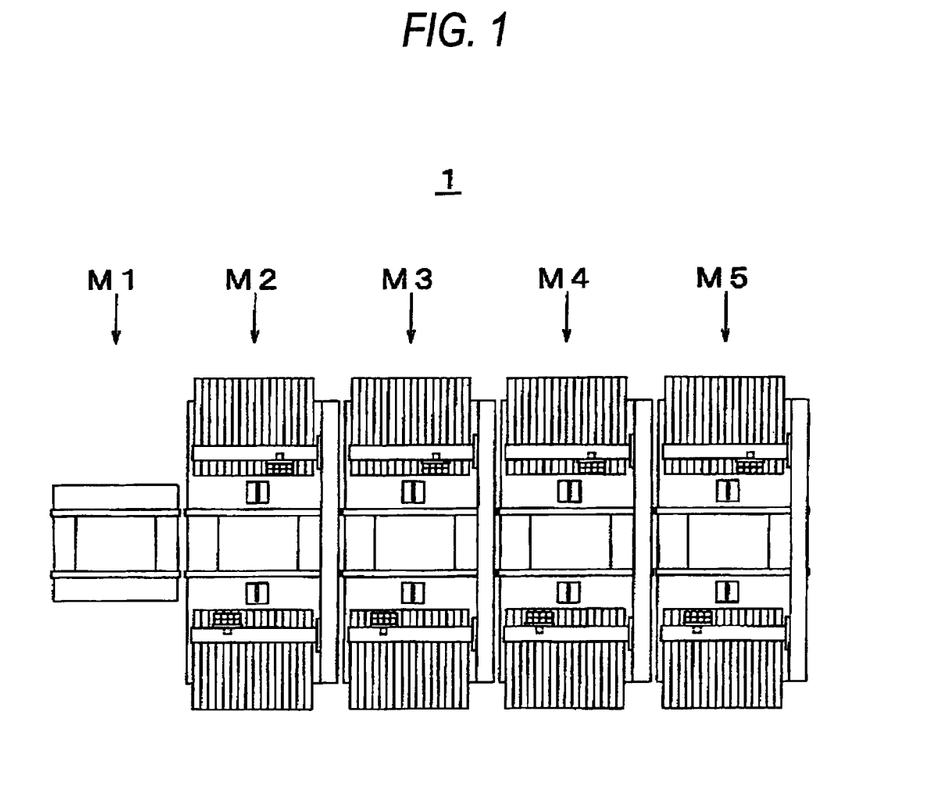
FIG. 1 illustrates the configuration of an electronic component mounting system according to an embodiment of the invention.
Figure 2:
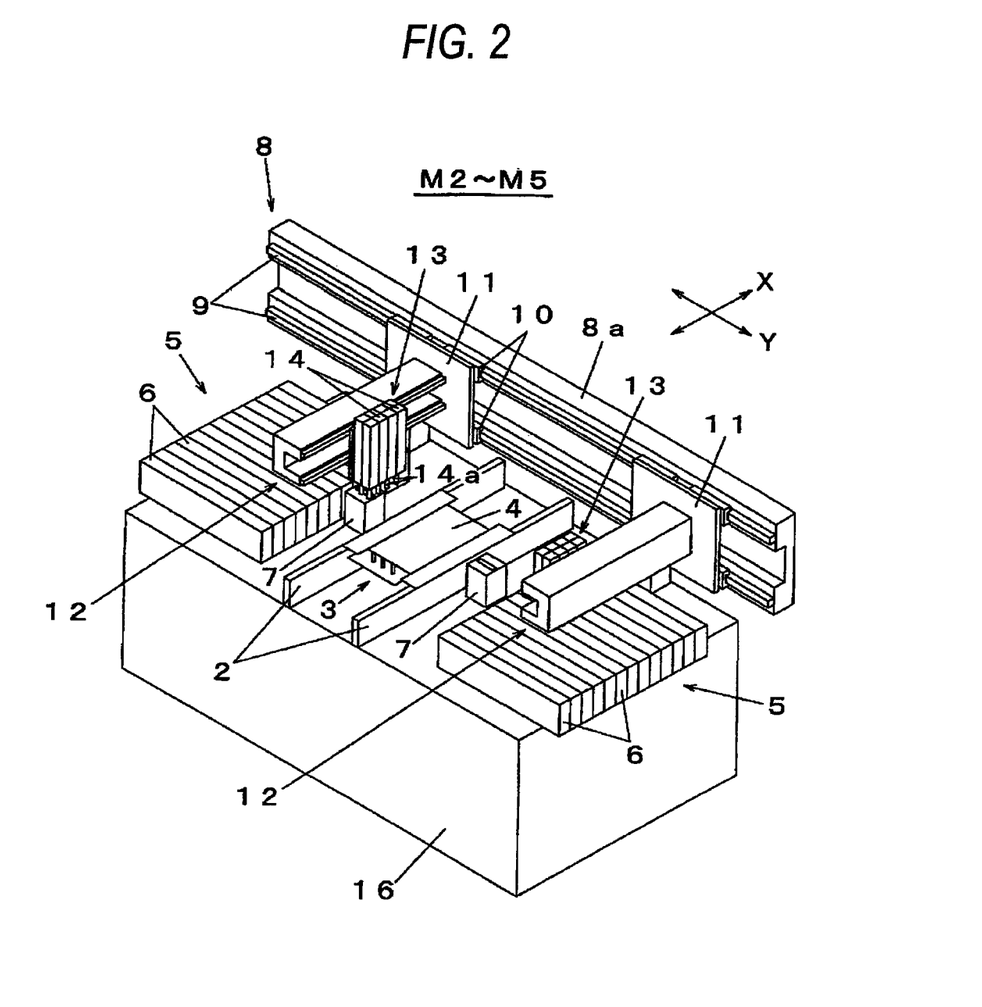
FIG. 2 is a perspective view of an electronic component mounting apparatus of the electronic component mounting system according to the embodiment of the invention.
Figure 3:
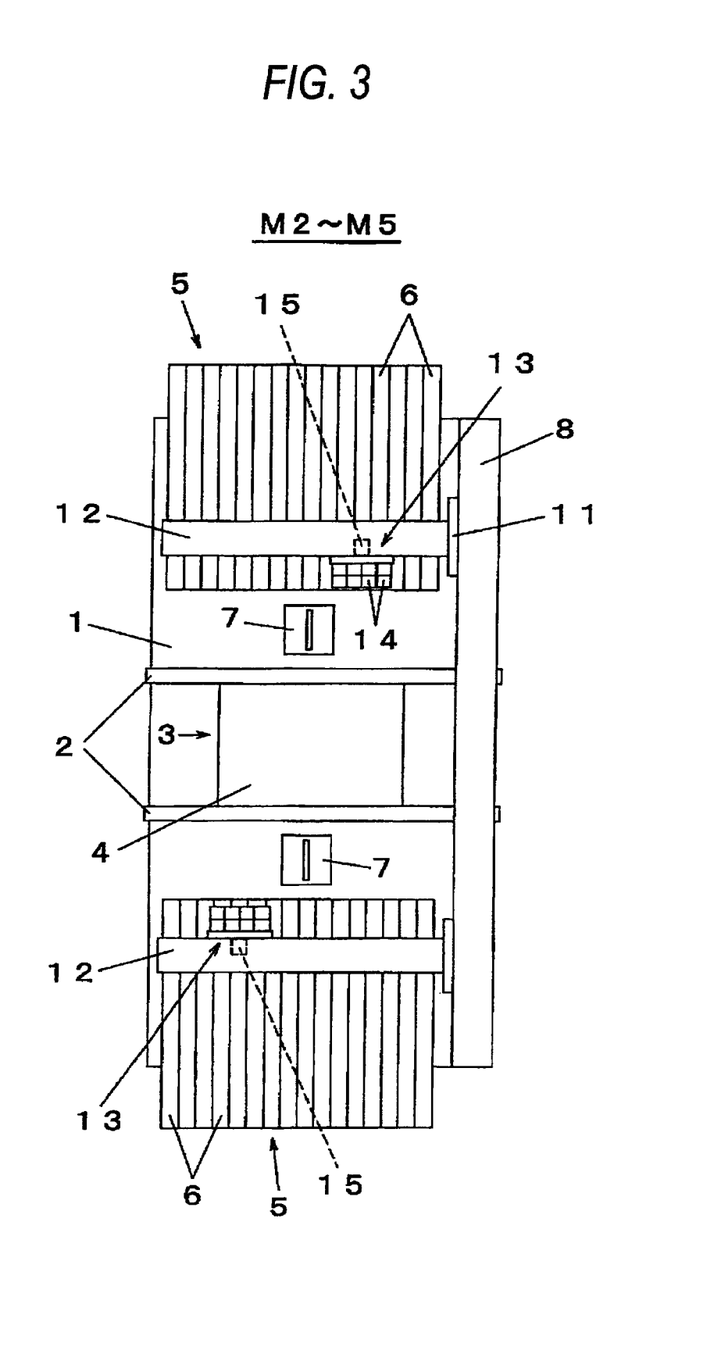
FIG. 3 is a plan view of an electronic component mounting apparatus of the electronic component mounting system according to the embodiment of the invention.
Figure 4A:
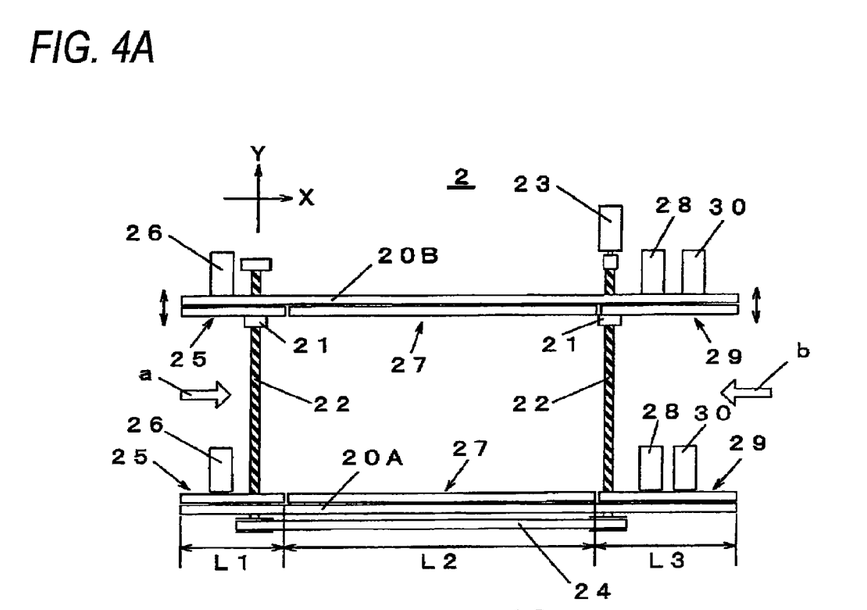
FIGS. 4A and 4B illustrate the structure of a substrate transfer mechanism in an electronic component mounting apparatus of the electronic component mounting system according to the embodiment of the invention.
Figure 4B:
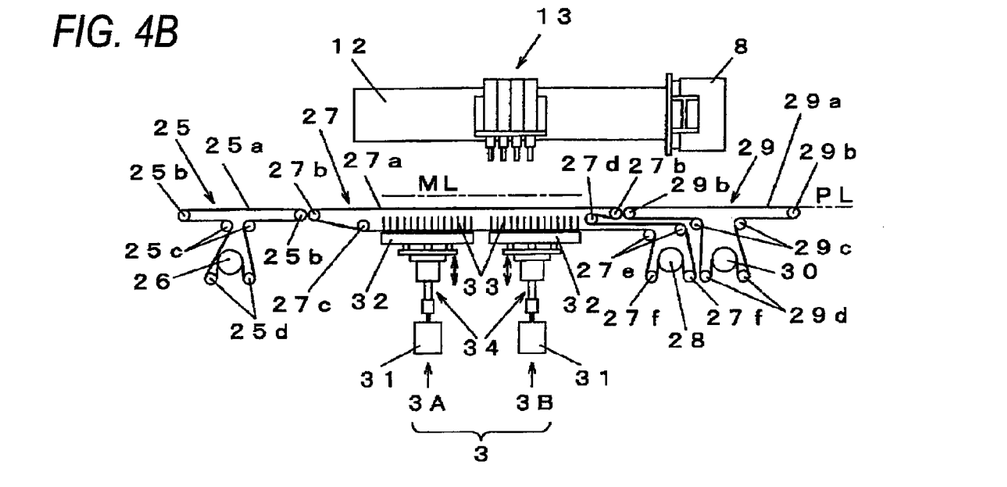
Figure 5:
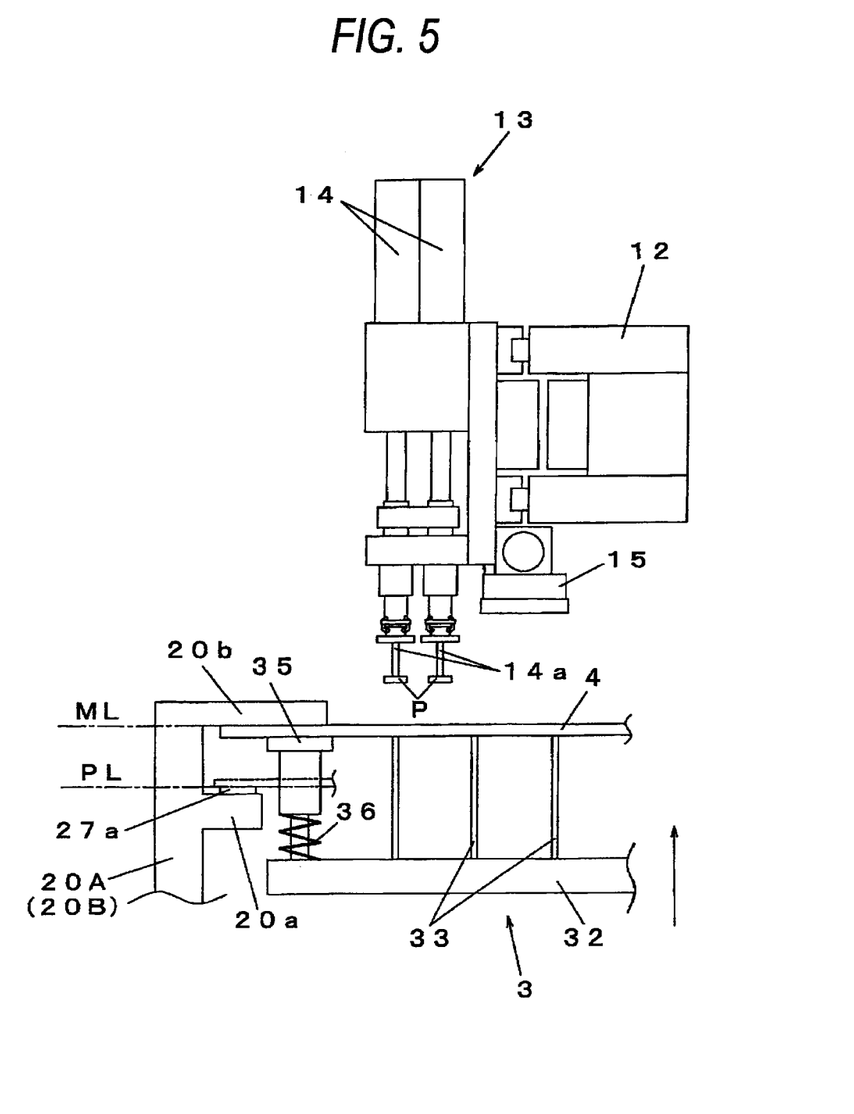
FIG. 5 is a partial cross-sectional view of an electronic component mounting apparatus of the electronic component mounting system according to the embodiment of the invention.
Figure 6A:
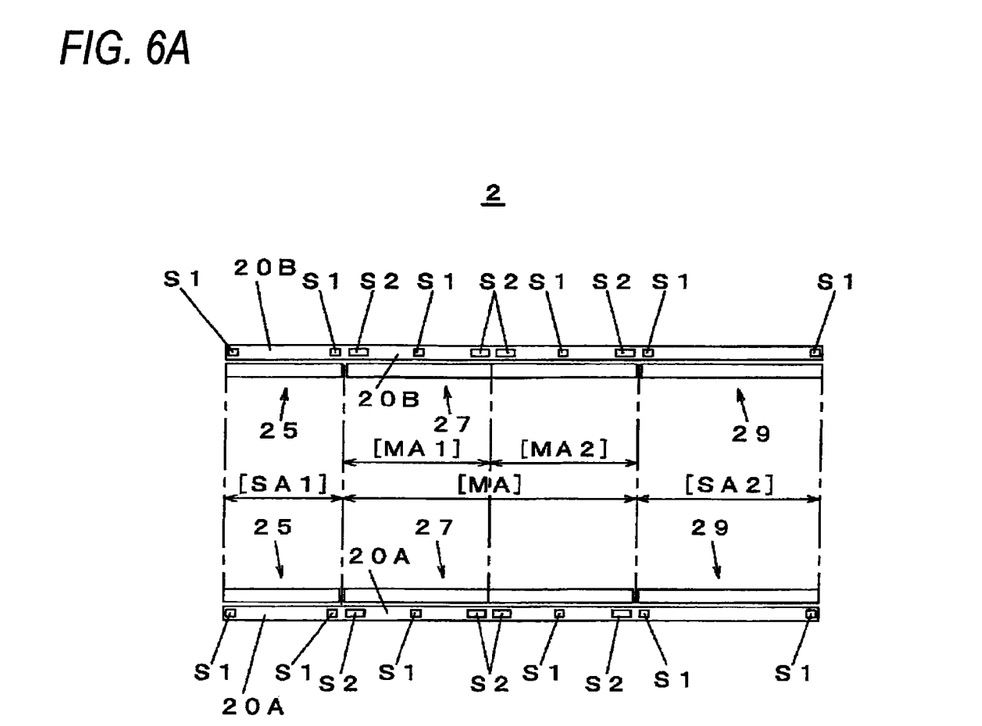
FIGS. 6A and 6B illustrate a mounting area, a standby area and a sensor arrangement in an electronic component mounting apparatus of the electronic component mounting system according to the embodiment of the invention.
Figure 6B:
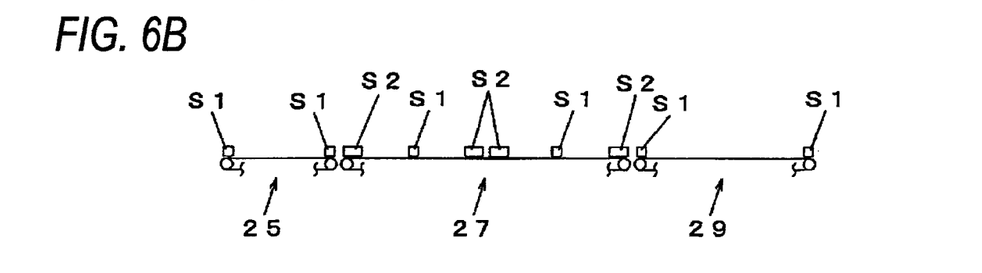
Figure 7A:
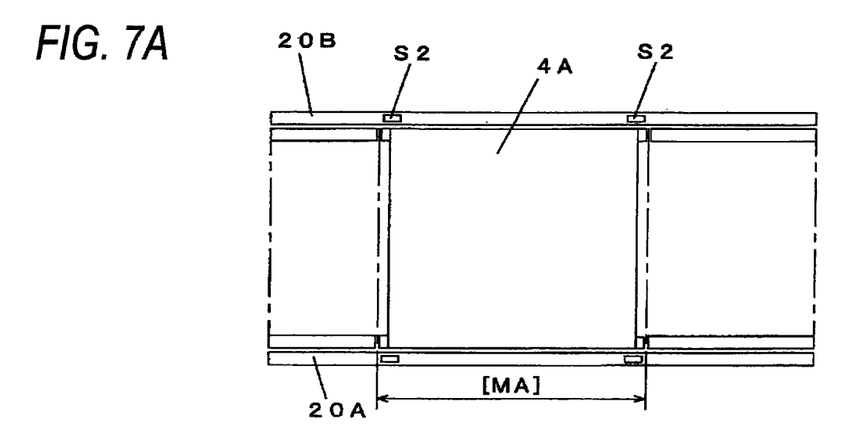
FIGS. 7A and 7B illustrate the substrate placement state in an electronic component mounting apparatus of the electronic component mounting system according to the embodiment of the invention.
Figure 7B:
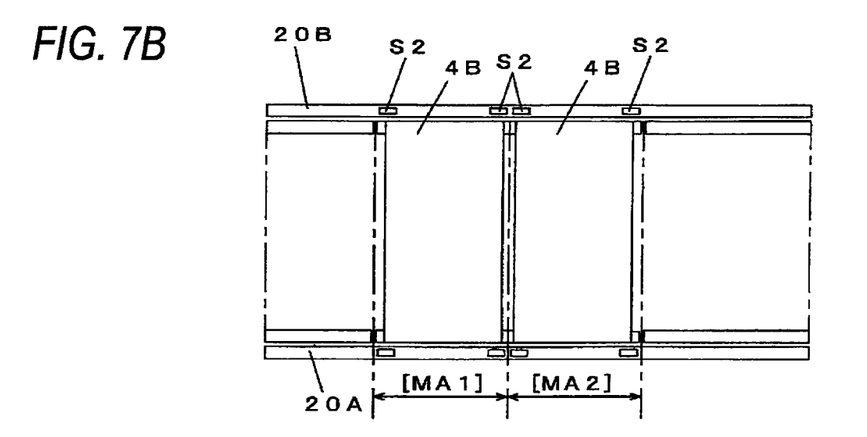
Figure 8A:
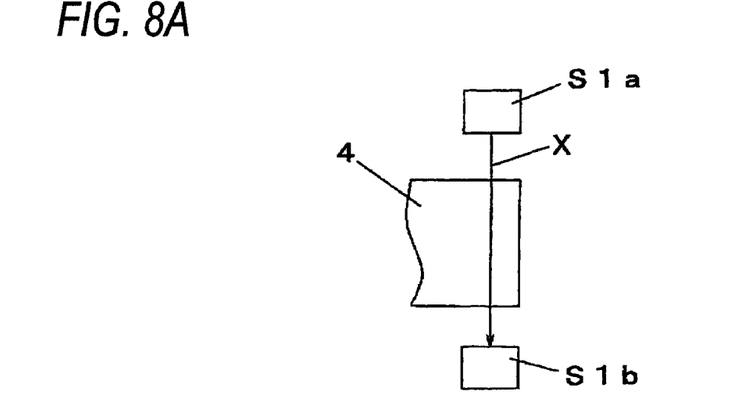
FIGS. 8A and 8B illustrates the functions of a sensor used in an electronic component mounting apparatus of the electronic component mounting system according to the embodiment of the invention.
Figure 8B:
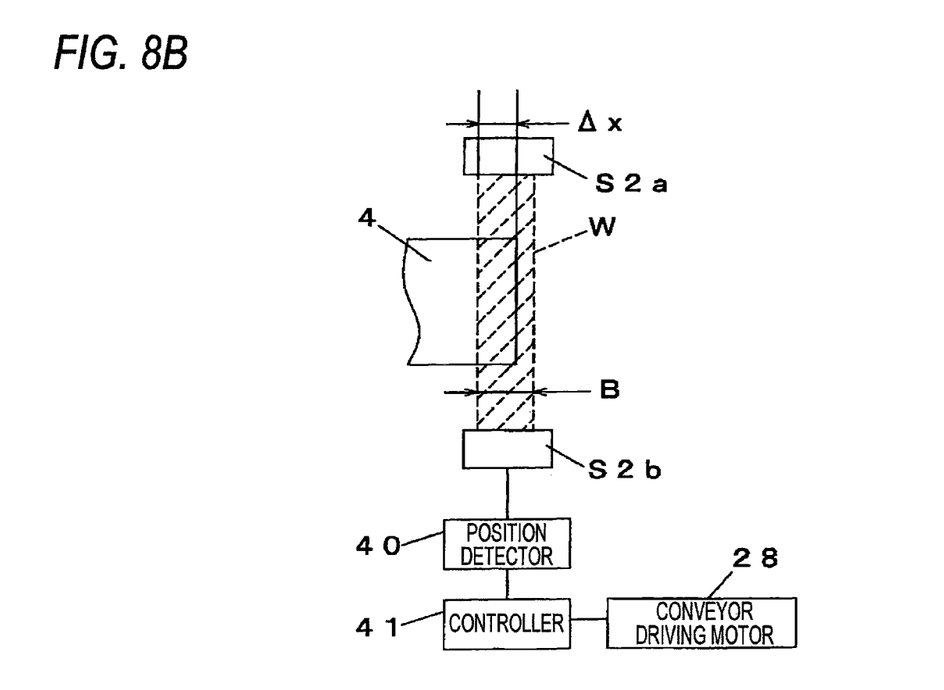
Figure 9:
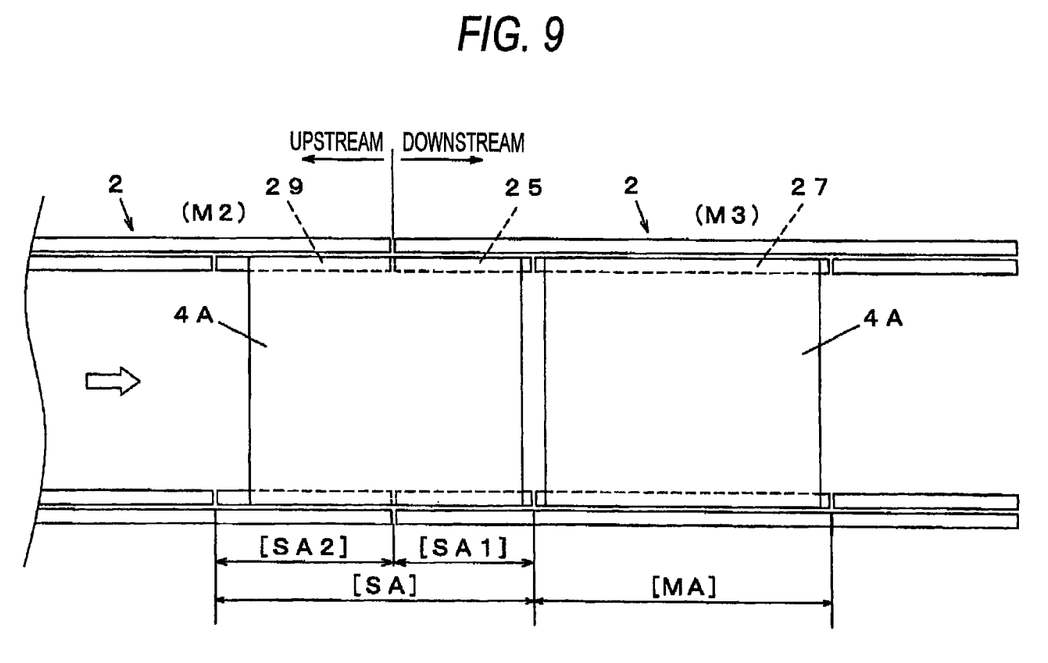
FIG. 9 illustrates a substrate standby state in the electronic component mounting system according to the embodiment of the invention.

Next, an embodiment of the invention will be described referring to figures. FIG. 1 illustrates the configuration of an electronic component mounting system according to an embodiment of the invention. FIG. 2 is a perspective view of an electronic component mounting apparatus of the electronic component mounting system according to the embodiment of the invention. FIG. 3 is a plan view of an electronic component mounting apparatus of the electronic component mounting system according to the embodiment of the invention. FIGS. 4A and 4B illustrate the structure of a substrate transfer mechanism in an electronic component mounting apparatus of the electronic component mounting system according to the embodiment of the invention. FIG. 5 is a partial cross-sectional view of an electronic component mounting apparatus of the electronic component mounting system according to the embodiment of the invention. FIGS. 6A and 6B illustrate a mounting area, a standby area and a sensor arrangement in an electronic component mounting apparatus of the electronic component mounting system according to the embodiment of the invention. FIGS. 7A and 7B illustrate the substrate placement state in an electronic component mounting apparatus of the electronic component mounting system according to the embodiment of the invention. FIGS. 8A and 8B illustrate the functions of a sensor used in an electronic component mounting apparatus of the electronic component mounting system according to the embodiment of the invention. FIG. 9 illustrates a substrate standby state in the electronic component mounting system according to the embodiment of the invention.

Configuration of the electronic component mounting system capable of mounting an electronic component on a substrate to manufacture a mounted substrate will be described referring to FIG. 1. In FIG. 1, an electronic component mounting system 1 includes a plurality of electronic component mounting apparatuses M2, M3, M4, M5 coupled in series downstream of a substrate supply apparatus M1 and a reflow apparatus (not shown) coupled to the electronic component mounting apparatuses further downstream thereof. The substrate supply apparatus M1 has a function to accommodate a plurality of unmounted substrates and to sequentially supply the substrates one by one to an apparatus arranged downstream. Substrates supplied to the downstream electronic component mounting apparatus M2 by the substrate supply apparatus M1 are transferred downstream in the order of the electronic component mounting apparatuses M2, M3, M4 and M5. In this transfer process, electronic components are mounted on respective substrates by any of the electronic component mounting apparatuses.

Next, the structure of the electronic component mounting apparatuses M2 to M5 will be described referring to FIGS. 2 and 3. The electronic component mounting apparatuses are used in an electronic component mounting system for mounting electronic components on substrates to manufacture mounted substrates and have a function to pick up electronic components from the component supply part and mount the electronic components on the substrates. In FIGS. 2 and 3, a substrate transfer mechanism 2 is arranged in an X-direction on a base 16. The substrate transfer mechanism 2 includes a substrate underside support part 3. A substrate 4 supplied from an apparatus on the upstream side and subjected to the mounting work operation by the pertinent electronic component mounting apparatus is transferred to the substrate underside support part 3 by the substrate transfer mechanism 2. The substrate 4 thus transferred is supported from underneath by the substrate underside support part 3. In this state, component mounting work by a component mounting mechanism described below takes place. The substrate 4, on which the component mounting work is complete, is further transferred downstream by the substrate mounting mechanism 2 and carried out to an apparatus on the downstream side.

On both ends of the substrate transfer mechanism 2 are arranged component supply parts 5. The component supply part 5 has a plurality of tape feeders 6 attached thereto. On one end of the base 16 in the X-direction is horizontally arranged in the Y-direction a Y-axis moving table 8 including a linear driving mechanism. The Y-axis moving table 8 is mainly composed of a beam member 8a arranged horizontally in a slim shape. The beam member 8a includes a linear rail 9 horizontally arranged thereon. To the linear rail 9 are slidably attached two coupling brackets 11 in a rectangular shape in the Y-direction respectively via linear blocks 10. To the two coupling brackets 11 are coupled X-axis movement tables 12 including a linear driving mechanism similar to that of the Y-axis movement table 8. To each X-axis movement table 12 is attached a mounting head 13 movably in the X-direction.

The mounting head 13 is a multiple mounting head including a plurality of (in this example eight) unit mounting heads 14. At the lower end of each unit mounting head 14 is attached a suction nozzle 14a for sucking and retaining an electronic component. The suction nozzle 14a is individually elevated or lowered by a nozzle elevating mechanism housed in the unit mounting head 14. The Y-axis moving table 8 and the X-axis moving tables 12 constitute a head moving mechanism. Driving the head moving mechanism moves the mounting head 13 in the X-direction or Y-direction, which allows each unit mounting head 14 to pick up an electronic component from the tape feeder 6 of the component supply part 5 and transfer and mount the electronic component onto the substrate 4 positioned by the substrate transfer mechanism 2 and supported from underneath by the substrate underside support part 3.

The Y-axis moving table 8, a first X-axis moving table 12 and the mounting head 13 function as a component mounting mechanism for moving the mounting head 13 retaining an electronic component by the head moving mechanism to transfer and mount the electronic component onto the substrate 4, that is, a work operation mechanism in an electronic component mounting apparatus for executing the work operation of the same apparatus as an apparatus for mounting electronic components. Between the component supply part 5 and the substrate transfer mechanism 2 is arranged a component recognition apparatus 7. When the mounting head 13 that has picked up an electronic component from the component supply part 5 moves above the component recognition apparatus 7, the component recognition apparatus 7 images and recognizes the electronic component retained by the mounting head 13.

The mounting head 13 has a substrate recognition camera 15 attached thereto positioned on the bottom surface of the X-axis moving table 12 and moving integrally with the latter (refer to FIG. 5). When the mounting head 13 moves, the substrate recognition camera 15 moves above the substrate 4 supported by the substrate underside support part 3 and then images and recognizes the substrate 4. In the operation of mounting an electronic component onto the substrate 4 by the mounting head 13, both the result of recognition of an electronic component by the component recognition apparatus 7 and the result of recognition of the substrate by the substrate recognition camera 15 are taken into consideration to perform correction of the mounting position.

Next, the structure of the substrate transfer mechanism 2 will be described referring to FIGS. 4A and 4B. As shown in FIG. 4A, the substrate transfer mechanism 2 includes two rails, that is, a fixed transfer rail 20A and a moving transfer rail 20B each including a horizontal conveyor mechanism therein, arranged parallel to each other. Two feed screws 22 penetrate the fixed transfer rail 20A and the moving transfer rail 20B. A nut member 21 screwed on a feed screw 22 is fixed to the moving transfer rail 20B. One feed screw 22 serves as a driving shaft driven to rotate by a width adjusting motor 23. The other feed screw 22 is driven to rotate by the driving shaft via a belt 24. When the width adjusting motor 23 is driven, the nut members 21 screwed on two feed screws 22 move in the Y-direction (direction orthogonal to the substrate transfer direction) together with the moving transfer rail 20B, which makes it possible to adjust the transfer width in the substrate transfer mechanism 2 in accordance with the width of the substrate 4 to be transferred.

A conveyor mechanism arranged on these transfer rails is divided into three belt conveyor mechanisms with respect to the substrate transfer direction, that is, a first transfer conveyor 25 having a conveyor length L1 driven by a conveyor driving motor 26, a mounting conveyor 27 having a conveyor length L2 driven by a conveyor driving motor 28, and a second transfer conveyor 29 having a conveyor length L3 driven by a conveyor driving motor 30. As shown in FIG. 4B, each of the first transfer conveyor 25, mounting conveyor 27 and second transfer conveyor 29 is arranged with the transfer surface aligned with a substrate transfer level PL in the electronic component mounting system 1. These conveyor mechanisms may be used with the transfer direction reversed between normal and reverse directions. In FIGS. 4A and 4B, the substrate 4 transferred from the left side (in the direction of an arrow a) is passed to the mounting conveyor 27 via the first transfer conveyor 25. The substrate 4 transferred from the right side (in the direction of an arrow b) is passed to the mounting conveyor 27 via the second transfer conveyor 29.

In the above configuration, the mounting conveyor 27 serves as a work conveyor to transfer the substrate 4 to a work position (mounting work position) of an electronic component by a work operation mechanism (component mounting mechanism) by a belt conveyor. In case the substrate transfer direction is set to the direction of an arrow a in FIG. 4A, the first transfer conveyor 25 is arranged adjacent to the mounting conveyor 27 as a work conveyor upstream thereof and has a function as a carry-in conveyor for carrying the substrate 4 transferred from upstream into the mounting conveyor 27. The second transfer conveyor 29 is arranged adjacent to the mounting conveyor 27 upstream thereof and functions as a carry-out conveyor for carrying the substrate 4 out of the mounting conveyor 27. In case the substrate transfer direction is switched and the substrate is transferred in the direction of the arrow b in FIG. 4A, the second transfer conveyor 29 serves as a carry-in conveyor and the first transfer conveyor serves 25 as a carry-out conveyor.

The structure of each conveyor mechanism will be described referring to FIG. 4B. The first transfer conveyor 25 horizontally puts a conveyor belt 25a on two pulleys 25b arranged with a spacing corresponding to the conveyor length L1 and guides the conveyor belt 25a to the driving pulley of a conveyor driving motor 26 via pulleys 25c, 25d. In this configuration, when the conveyor driving motor 26 is driven normally and reversely, the conveyor belt 25a reciprocates on the substrate transfer level PL, which transfers the substrate 4 placed on the conveyor belt 25a in normal and reverse directions. In the system for guiding the conveyor belt 25a, it is possible to match the surface of transfer of the substrate 4 by the conveyor belt 25a and the contact driving surface of the conveyor belt 25a coming into contact with the driving pulley of the conveyor driving motor 26 through addition of a pulley 25d thus offering a slip-reduced belt conveyor mechanism.

The mounting conveyor 27 horizontally puts a conveyor belt 27a on two pulleys 27b arranged with a spacing corresponding to the conveyor length L2 and guides the conveyor belt 27a to the driving pulley of a conveyor driving motor 28 via pulleys 27c, 27d, 27e, 27f. In this configuration, when the conveyor driving motor 28 is driven normally and reversely, the conveyor belt 27a reciprocates on the substrate transfer level PL, which transfers the substrate 4 placed on the conveyor belt 27a in normal and reverse directions. In the system for guiding the conveyor belt 27a also, the surface of transfer of the substrate 4 by the conveyor belt 27a is matched, through pulley arrangement, with the contact driving surface of the conveyor belt 27a coming into contact with the driving pulley of the conveyor driving motor 28.

The second mounting conveyor 29 horizontally puts a conveyor belt 29a on two pulleys 29b arranged with a spacing corresponding to the conveyor length L3 and guides the conveyor belt 29a to the driving pulley of a conveyor driving motor 30 via pulleys 29c, 29d. In this configuration, when the conveyor driving motor 30 is driven normally and reversely, the conveyor belt 29a reciprocates on the transfer level, which transfers the substrate 4 placed on the conveyor belt 29a in normal and reverse directions. In the system for guiding the conveyor belt 29a also, the surface of transfer of the substrate 4 by the conveyor belt 29a is matched, through pulley arrangement, with the contact driving surface of the conveyor belt 29a coming into contact with the driving pulley of the conveyor driving motor 30.

Next, the substrate underside support part 3 arranged below the mounting conveyor 27 will be described. The substrate underside support part 3 has a function to support the substrate 4 from underneath in the component mounting operation. In this embodiment, a plurality of (in this example two) substrate underside support parts 3, that is, a first underside support part 3A and a second underside support part 3B that are individually operable are arranged in correspondence to the arrangement of a first divided mounting area [MA1] and a second divided mounting area [MA2] shown in FIGS. 6A and 6B, that is, mounting work positions by the component mounting mechanism, so as to make it possible to individually position a plurality of (in this example two) substrates on the mounting conveyor 27 for subsequent component mounting operation.

The first underside support part 3A and the second underside support part 3B have the same structure. The underside support part 3A, 3B elevates/lowers an underside support block 32 on which underside support pins 33 are planted by an elevating mechanism 34 driven by an elevation driving motor 31. When the elevation driving motor 31 is driven, the underside support pins 33 as an underside support member are elevated/lowered, together with the underside support block 32, by the elevating mechanism 34. The underside support pins 33 thus abut against the bottom surface of the substrate 4 carried into the mounting work position and elevate the substrate 4 from the conveyor belt 27a to a work height position by the mounting head 13 of the component mounting mechanism, that is, a component mounting level ML, and retains the substrate 4 at the level.

The method for supporting the substrate 4 with the substrate underside support part 3 in the substrate transfer mechanism 2 will be detailed referring to FIG. 5. Each of the fixed transfer rails 20A and the moving transfer rail 20B includes a belt receiving part 20a to cause the conveyor belt 27a to run at the substrate transfer level PL and a substrate pressing member 20b for retaining, at the component mounting level ML, the top surface of the substrate 4 elevated by the substrate underside support part 3. At the side end of the underside support block 32 is arranged, while urged upward by a spring member 36, a holding member 35 for abutting against the bottom surface of the substrate 4 and holding the substrate 4 with respect to the substrate pressing member 20b.

When the substrate 4 transferred by the mounting conveyor 27 has reached the component mounting work position, the underside support block 32 is elevated to cause the holding member 35 to abut against the bottom surface of the substrate 4 and elevates the substrate 4 from the transfer level by the conveyor 27a. The underside support member 32 is further elevated until the top surface of the substrate 4 abuts against the bottom surface of the substrate pressing member 20b to cause the substrate 4 clamped by the holding member 35 and the substrate pressing member 20b. In this state, the apex part of each of the underside support pins 33 abuts against the bottom surface of the substrate 4 to support the entire substrate 4 from underneath. On the substrate 4 with its side ends clamped and bottom surface supported by the underside support pins 33 is mounted an electronic component P sucked and held by the suction nozzle 14a of each unit mounting head 14.

The conveyor driving motor 28 for driving the mounting conveyor 27 in the substrate transfer mechanism 2 is arranged below the Y-axis moving table 8 of the component mounting mechanism rather than immediately below the mounting conveyor 27 in order to prevent interference with the substrate underside support part 3. By using such an arrangement, it is possible to provide space for arranging below the mounting conveyor 27 a substrate underside support part 3 composed of a first underside support part 3A and a second underside support part 3B. In other words, in the electronic component mounting apparatus shown in this embodiment, the Y-axis moving table 8 constituting a head moving mechanism and moving the mounting head 13 in a direction (Y-direction) orthogonal to the substrate transfer direction (X-direction) is arranged above the second transfer conveyor 29 as a carry-in conveyor. The conveyor driving motor 28 for driving the mounting conveyor 27 is arranged below the Y-axis moving table 8.

Next, area division in the substrate transfer mechanism 2 and the types and arrangement of a sensor used for positioning or transfer control of the substrate 4 in each area will be described referring to FIGS. 6A and 6B. In FIGS. 6A and 6B, the range corresponding to the mounting conveyor 27 is a mounting area [MA] where a substrate on which an electronic component is to be mounted is positioned and retained. The mounting area [MA] is divided into plural areas (two areas in this example), a first divided mounting area [MA1] and a second divided mounting area [MA2] in order to simultaneously position and retain a plurality of (in this example two) small-sized substrates.

In case a large-sized substrate at most one of which is loadable in the mounting area [MA] of the mounting conveyor 27 is handled, a single substrate 4A is positioned in the mounting area [MA] and supported from underneath with the first underside support part 3A and the second underside support part 3B as shown in FIG. 7A. In case a plurality of (in this example two) small-sized substrates 4B loadable in the mounting area [MA] are handled, two substrates 4B are individually positioned into respective component mounting positions of the first mounting area [MA1] and the second mounting area [MA2] and individually supported from underneath respectively with the first underside support part 3A and the second underside support part 3B as shown in FIG. 7B.

A first standby area [SA1] and a second standby area [SA2] are set in correspondence to the first transfer conveyor 25 and the second transfer conveyor 29 respectively upstream of the mounting area [MA] (left side in FIGS. 6A and 6B) and downstream of the mounting area [MA] (right side in FIGS. 6A and 6B). The first standby area [SA1] is a standby area where the substrate 4 to be carried into the mounting area [MA] is placed in a standby state until transfer timing is reached. The second standby area [SA2] functions as a standby area where the substrate 4 carried out of the mounting area [MA] is placed in a standby state until downstream transfer of the substrate 4 is permitted. In case the substrate transfer direction is reversed, the first standby area [SA1] and the second standby area [SA2] change functions.

Substrate detecting sensors S1 as a pair are arranged while opposed to each other in the positions corresponding to both ends of each of the first standby area [SA1] and the second standby area [SA2] on the top surface of the fixed transfer rail 20A and the moving transfer rail 20B. Substrate positioning sensors S2 as a pair are arranged while opposed to each other in the positions corresponding to both ends of each of the first divided mounting area [MA1] and the second divided mounting area [MA2]. Substrate detecting sensors S1 as a pair are arranged while opposed to each other in the positions corresponding to the center position of each of the first divided mounting area [MA1] and the second divided mounting area [MA2], respectively.

The functions of the substrate detecting sensor S1 and the substrate positioning sensor S2 will be described referring to FIGS. 7A and 7B. The substrate detecting sensor S1 is a transmission optical sensor composed of a combination of a light projector S1a and a light receiver S1b. As shown in FIG. 8A, the substrate detecting sensor S1 detects presence/absence of the substrate 4 in the position of an optical axis X depending on whether the optical axis X is shielded by the substrate 4 to be detected. The substrate positioning sensor S2 shown in FIG. 8B has a function to detect which range is shielded by the substrate 4 in a light band W projected in a predetermined width B (several millimeters) from a light projector S2a to a light receiver S2b. In other words, a signal from the light receiver S1b is received by a position detector 40 and a measurement value $\Delta x$ is detected in which the position of the tip of the substrate 4 is associated with the reference position of the light band W (end or center of the light band W specified as required).

The substrate detecting sensor S1 in the first standby area [SA1] or second standby area [SA2] is used to detect the timing of deceleration or halt of the substrate 4 transferred from upstream. The substrate positioning sensor S2 in the first divided mounting area [MA1] or second divided mounting area [MA2] is used to detect a position for positioning the substrate 4 passed from the first transfer conveyor 25 in a mounting work position by the component mounting mechanism.

To be more specific, in the first divided mounting area [MA1] and second divided mounting area [MA2], the substrate positioning sensor S2 is arranged in a position corresponding to the front edge or rear edge of the substrate 4 in a state where the substrate 4 is placed in a position for the component mounting work. The position of the front edge or rear edge of the substrate 4 is detected by the position detector 40 by using the substrate positioning sensor S2 in a state where the substrate 4 transferred from upstream has halted and the detection result is transmitted to a controller 41. In case the actual halt position is within a preset positioning allowance range, the substrate 4 is correctly positioned and component mounting operation is made on the substrate 4 in the positioned state.

The mounting head 13 is moved together with the substrate recognition camera 15 to above the substrate 4 and the substrate 4 is imaged with the substrate recognition camera 15 to perform substrate recognition, and then the mounting head 13 is used to transfer and mount an electronic component onto the substrate 4. In case it is detected by the substrate positioning sensor S2 that the actual halt position of the substrate 4 is displaced beyond the positioning error range, the controller 41 controls the conveyor driving motor 28 to move the conveyor belt 27a by the detected displacement amount to correct the halt position of the substrate 4.

The position detector 40 that detects the position of the substrate 4 based on a detection signal from the substrate positioning sensor S2 and the controller 41 that performs operation control of the conveyor driving motor 28 based on the position detection result of the position detector 40 constitute a substrate positioning unit for positioning the substrate 4 in a mounting work position by the component mounting mechanism. In this way, according to the substrate positioning system using the substrate positioning sensor S2, a mechanical impact does not occur that is caused by the edge of a substrate abutting against a stopper member when the substrate is halted while it is being transferred, and failure attributable to an impact can be eliminated, unlike in a mechanical positioning system by a mechanical stopper used in related art apparatuses. It is thus possible to eliminate failure caused by an impact.

This embodiment uses a configuration where two substrate positioning sensors S2 are arranged in each of the first divided mounting area [MA1] and the second divided mounting area [MA2]. In case a small-sized substrate 4B is to be handled, the substrate 4 can be positioned individually in the first divided mounting area [MA1] and the second divided mounting area [MA2]. In case a large-sized substrate 4A is to be handled, the front edge or rear edge of the substrate 4A placed across the mounting area [MA] is detected by the substrate positioning sensor S2 positioned at each of the ends of the mounting area [MA]. That is, this embodiment includes a substrate positioning unit for individually positioning a single substrate 4A or a plurality of substrates 4B respectively in a single mounting work position (mounting area [MA]) or a plurality of mounting work positions (first divided mounting area [MA1], second divided mounting area [MA2]) on the mounting conveyor 27.

As shown in FIGS. 4A and 4B, a first underside support part 3A and a second underside support part 3B are respectively arranged on the mounting conveyor 27 in correspondence to the first divided mounting area [MA1] and the second divided mounting area [MA2] shown in FIGS. 6A and 6B. Further, the substrate positioning unit is individually provided. This makes it possible to concurrently perform different work operations in two areas, that is, the first divided mounting area [MA1] and the second divided mounting area [MA2]. In other words, while component mounting operation is being performed on the substrate 4B previously carried into the second divided mounting area [MA2], the substrate 4B is elevated from the conveyor belt 27a by the first underside support part 3A, so that the mounting conveyor 27 is operable irrespective of the substrate 4 in the second divided mounting area [MA2]. Therefore, the mounting conveyor 27 is driven, and thereby. It is thus possible to concurrently perform substrate carry-in operation and positioning operation on the subsequent substrate 4 in the first divided mounting area [MA1].

FIG. 9 shows a state where the substrate transfer mechanisms 2 of both of an apparatus on the upstream side (for example an electronic component mounting apparatus M2) and an apparatus on the downstream side (for example an electronic component mounting apparatus M3) shown in this embodiment are coupled in series. In this state, the second transfer conveyor 29 of the upstream apparatus is coupled to the first transfer conveyor 25 of the downstream apparatus. As shown in FIG. 9, the second standby area [SA2] in the upstream apparatus and the first standby area [SA1] in the upstream apparatus are coupled to each other to form a standby area [SA] that can accommodate a larger-size substrate. That is, in a state where a plurality of electronic component mounting apparatuses M2 to M5 are coupled in series, the first transfer conveyor 25 (carry-in conveyor) of one electronic component mounting apparatus and the second transfer conveyor 29 (carry-out conveyor) of another electronic component mounting apparatus positioned upstream of the one electronic component mounting apparatus form a substrate standby area for temporarily placing the substrate 4A to be carried into the mounting conveyor 27 (work conveyor) of the one electronic component mounting apparatus. In this way, an arrangement where the substrate 4A assumed before being carried into the mounting conveyor 27 is placed in a standby state across plural electronic component mounting apparatuses is introduced to eliminate useless apparatus space and accelerate the shrinking speed of a facility.

The electronic component mounting method using the electronic component mounting system described in this embodiment temporarily places the substrate to be carried into one electronic component mounting apparatus in a standby state in a substrate standby area formed by the carry-in conveyor of one electronic component mounting apparatus and the carry-out conveyor of another electronic component mounting apparatus positioned upstream of the one electronic component mounting apparatus while a plurality of electronic component mounting apparatuses M2 to M5 are coupled in series. This eliminates the waste of time attributable to transfer of substrates and enhances the production efficiency.

Assume a case where plural types of substrates in various sizes are handled by a single electronic component mounting system. In case a compact substrate 4B of a small length dimension is handled, component mounting operation can be executed concurrently on a plurality of substrates 4B. That is, what is provided is a versatile facility capable of efficiently performing the substrate transfer operation and component mounting operation for plural types of substrates having different sizes. It is possible to perform flexible component mounting operation on plural types of substrates by a compact facility thus enabling flexible component mounting work.

While the electronic component mounting apparatus for mounting an electronic component on a substrate is described as an example of an electronic component mounting apparatus in the example included in this embodiment, the configuration of the inventive substrate transfer mechanism 2 is also applicable to a solder printing apparatus for printing a solder for bonding an electronic component on a substrate and an inspection apparatus for inspecting substrates as long as such an apparatus constitute an electronic component mounting system.

The electronic component mounting system and the electronic component mounting method of the invention advantageously have a capability to eliminate the waste of time attributable to transfer of substrates and enhance the production efficiency by a compact facility and are useful in the field of mounting electronic components on a substrate by using a plurality of electronic component mounting apparatuses to manufacture a mounted substrate.

What is claimed is:

1. An electronic component mounting system including a plurality of electronic component mounting apparatuses coupled in series for mounting electronic components on a substrate, each electronic component mounting apparatus comprising:
   a work operation mechanism for performing predetermined work operation for manufacturing a mounted substrate from said substrate;
   a work conveyor for transferring said substrate to a work position by said work operation mechanism by a belt-conveyor;
   a carry-in conveyor arranged adjacent to said work conveyor upstream thereof for carrying into said work conveyor said substrate carried in from upstream;
   a carry-out conveyor arranged adjacent to said work conveyor downstream thereof for carrying said substrate out of said work conveyor;
   a first substrate standby area for temporarily placing in a standby state a substrate carried into said work conveyor of said one electronic component mounting apparatus; and
   a second substrate standby area for temporarily placing in a standby state a substrate carried out of said work conveyor of said one electronic component mounting apparatus,
   wherein said carry-in conveyor forms said first substrate standby area and said carry-out conveyor forms said second substrate standby area, said first substrate standby area is formed such that the substrate that is before being carried into said work conveyor in said one electronic component mounting apparatus is placed in a standby state across said one and another electronic component mounting apparatuses and said second substrate standby area is formed such that the substrate that is after being carried out of said work conveyor in said one electronic component mounting apparatus is placed in a standby state across said one and another electronic component mounting apparatuses.

2. An electronic component mounting method for mounting electronic components on a substrate by an electronic component mounting system including a plurality of electronic component mounting apparatuses coupled in series, each electronic component mounting apparatus comprising:
   a work operation mechanism for performing predetermined work operation for manufacturing a mounted substrate from said substrate;
   a work conveyor for transferring said substrate to a work position by said work operation mechanism by a belt-conveyor;
   a carry-in conveyor arranged adjacent to said work conveyor upstream thereof for carrying into said work conveyor said substrate carried in from upstream;
   a carry-out conveyor arranged adjacent to said work conveyor downstream thereof for carrying said substrate out of said work conveyor;
   a first substrate standby area for temporarily placing in a standby state a substrate carried into said work conveyor of said one electronic component mounting apparatus; and
   a second substrate standby area for temporarily placing in a standby state a substrate carried out of said work conveyor of said one electronic component mounting apparatus,
   the method comprising a step of temporarily placing a substrate carried into said work conveyor of one electronic component mounting apparatus in a standby state in said first substrate standby area formed by said carry-in conveyor and temporarily placing a substrate carried out of said work conveyor of one electronic component mounting apparatus in a standby state in said second substrate standby area formed by said carry-out conveyor, the first substrate standby area is formed such that the substrate that is before being carried into said work conveyor in said one electronic component mounting apparatus is placed in a standby state across said one and another electronic component mounting apparatuses and said second substrate standby area is formed such that the substrate that is after being carried out of said work conveyor in said one electronic component mounting apparatus is placed in a standby state across said one and another electronic component mounting apparatuses.

* * * * *